(12) United States Patent
Hu et al.

(10) Patent No.: US 9,734,009 B2
(45) Date of Patent: Aug. 15, 2017

(54) DATA ENCODING TECHNIQUES FOR A DEVICE

(71) Applicant: SANDISK TECHNOLOGIES INC., Plano, TX (US)

(72) Inventors: Xinde Hu, San Jose, CA (US); Christopher John Petti, Mountain View, CA (US); Eran Sharon, Rishon Lezion (IL); Idan Alrod, Herzeliya (IL); Ariel Navon, Revava (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/878,901

(22) Filed: Oct. 8, 2015

(65) Prior Publication Data

US 2017/0102993 A1     Apr. 13, 2017

(51) Int. Cl.
*H03M 13/00* (2006.01)
*G06F 11/10* (2006.01)
*G11C 29/52* (2006.01)
*H03M 13/29* (2006.01)

(52) U.S. Cl.
CPC .......... *G06F 11/1068* (2013.01); *G11C 29/52* (2013.01); *H03M 13/2906* (2013.01)

(58) Field of Classification Search
CPC ... G06F 11/106; G11C 29/52; H03M 13/2906
See application file for complete search history.

(56) References Cited

U.S. PATENT DOCUMENTS

| 8,495,465 B1 | 7/2013 | Anholt et al. |
| 8,645,789 B2 | 2/2014 | Sharon et al. |
| 8,942,028 B1 | 1/2015 | Hu |
| 2012/0204077 A1* | 8/2012 | D'Abreu ................. G06F 11/10 714/755 |
| 2013/0024605 A1 | 1/2013 | Sharon et al. |
| 2013/0166988 A1 | 6/2013 | Sharon et al. |
| 2013/0246878 A1 | 9/2013 | Pancholi et al. |
| 2013/0318418 A1 | 11/2013 | Bedeschi et al. |

(Continued)

FOREIGN PATENT DOCUMENTS

EP         0240921 A2    10/1987

OTHER PUBLICATIONS

Alrod, et al., "Resistance-Based Memory with Auxiliary Redundancy Information", U.S. Appl. No. 14/620,753, filed Feb. 12, 2015, 37 pages.

(Continued)

*Primary Examiner* — Sam Rizk
(74) *Attorney, Agent, or Firm* — Toler Law Group, PC

(57) ABSTRACT

A data storage device includes a controller and a non-volatile memory coupled to the controller. The controller is configured to generate first parity information based on first data and to generate second parity information based on second data. The non-volatile memory is configured to store the first data and the second data. The data storage device also includes a buffer configured to store the first parity information. The controller is further configured to generate joint parity information associated with the first data and the second data in response to a combined data size of the first data and the second data satisfying a threshold.

28 Claims, 5 Drawing Sheets

(56) References Cited

U.S. PATENT DOCUMENTS

2014/0337681 A1 11/2014 Liang
2016/0156372 A1* 6/2016 Motwani ............. G06F 11/1076
714/755

OTHER PUBLICATIONS

D'Abreu, "Error Correcting Code Techniques for a Memory Having a Three-Dimensional Memory Configuration", U.S. Appl. No. 14/273,005, filed May 8, 2014, 74 pages.
Hu, et al., "Error Correcting Code Adjustment for a Data Storage Device", U.S. Appl. No. 14/304,277, filed Jun. 13, 2014, 43 pages.
Serban, et al., "Implementation of a (31, 16) BCH Code on a Microcontroller", Cornell University, ECE 476 Final Project, 2004, 16 pages.
International Search Report and the Written Opinion of the International Searching Authority mailed Jan. 10, 2017 in International Application No. PCT/US2016/051849, 11 pages.

* cited by examiner

DATA ENCODING TECHNIQUES FOR A DEVICE

FIELD OF THE DISCLOSURE

The present disclosure is generally related to devices and more particularly to data encoding techniques for devices.

BACKGROUND

Storage devices enable storage and retrieval of data. Examples of storage devices include volatile memory devices and non-volatile memory devices. A non-volatile memory retains data after a power-down event. In some cases, volatile memories enable low latency (e.g., fast read and write speeds).

Some storage devices include a non-volatile memory and a volatile memory to enable fast read and write speeds in connection with data retention after a power-down event. For example, a storage device may include a flash memory and a dynamic random access memory (DRAM). Prior to a power-down event, data stored at the DRAM may be transferred to the flash memory. In response to a power-up event, the data may be read from the flash memory and transferred to the DRAM. Transferring data from the DRAM to the flash memory (and vice versa) consumes time and power. In addition, use of multiple memory types in a storage device may cause high fabrication cost.

Some storage devices include a "universal" memory that functions as a non-volatile memory and as a volatile memory. A universal memory may be associated with fast read and write speeds and a relatively high bit error rate (BER). Data may be encoded using a relatively "strong" ECC scheme (e.g., using a large number of redundancy bits) to compensate for the relatively high BER (but use of the "strong" ECC scheme increases latency of read and write operations). As a result, universal memories are not widely used.

DETAILED DESCRIPTION

Figure 1:
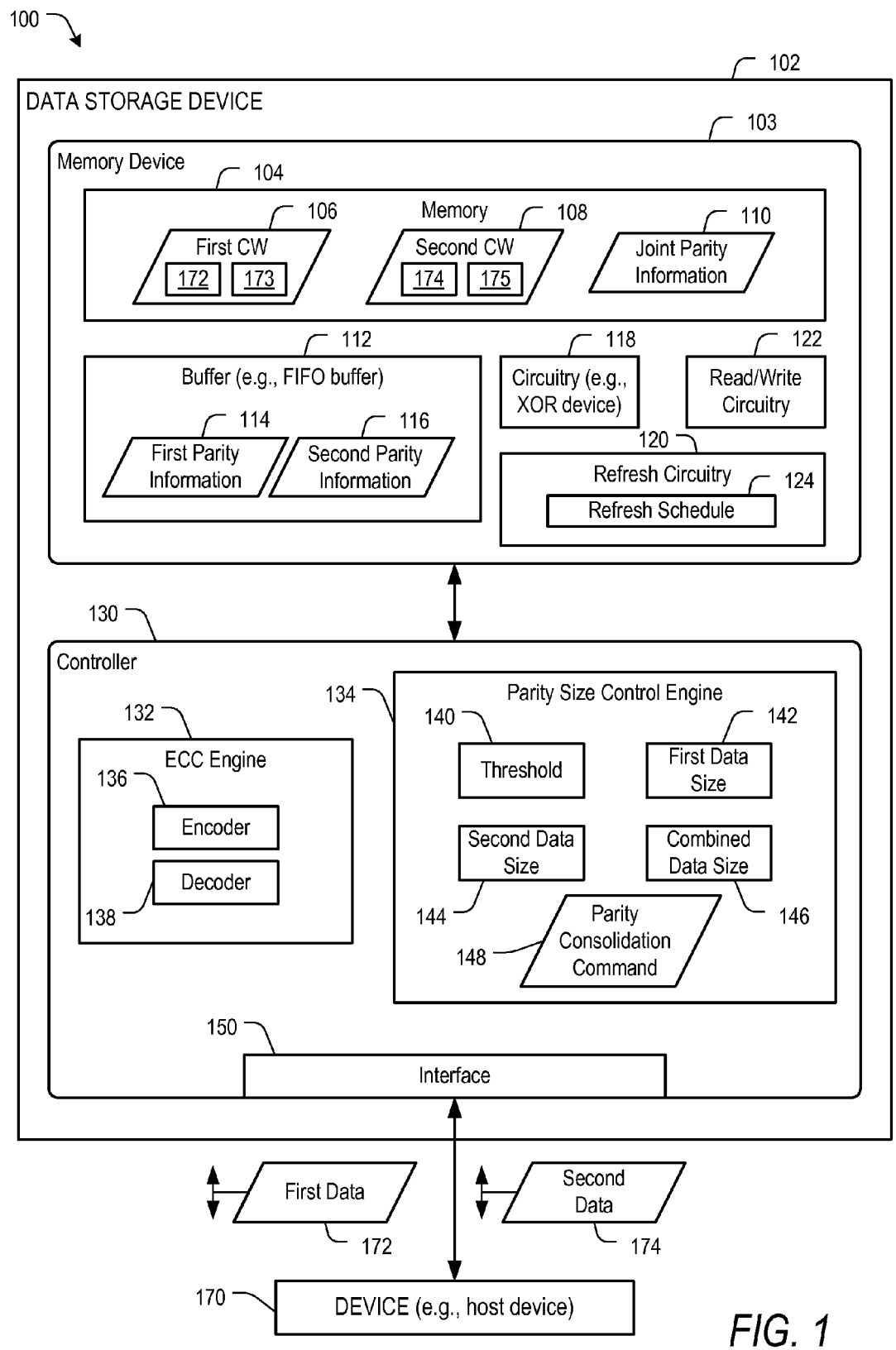
FIG. 1 is a diagram of a first particular illustrative example of a system that includes a data storage device having a parity size control engine.

A data storage device may use one or more techniques to vary a parity size associated with data stored at a memory of the data storage device. Varying the parity size may enable certain operating characteristics associated with a volatile memory (e.g., fast read and write speeds associated with a dynamic random access memory (DRAM) using a relatively "short" error correcting code) at a non-volatile memory while also facilitating high reliability (e.g., by transitioning to using a relatively "long" error correcting code in some cases). In an illustrative implementation, the non-volatile memory includes a resistance-based memory, such as a resistive random access memory (ReRAM). In other implementations, the non-volatile memory includes another memory, such as a flash memory.

In a data storage device (in a first example), first data is encoded to generate a first codeword and first parity information associated with the first codeword. The first codeword may have a relatively small size, and the first parity information may be generated using a "strong" error correcting code (e.g., using a low code rate) to increase error correction capability associated with the first codeword. The relatively small data size may enable relatively fast read and write speeds using a programming size associated with certain memory technologies (e.g., a programming size associated with DRAM technologies), and the first parity information may be used to compensate for certain data retention effects associated with particular non-volatile memories. As an illustrative example, the first parity information may be used to error-correct and "refresh" the first codeword to compensate for a relaxation effect associated with certain non-volatile storage elements, such as resistance-based storage elements.

After using the first redundancy information to refresh the first codeword, the data storage device may generate joint parity information. For example, the data storage device may "aggregate" multiple codewords (e.g., the first codeword and a second codeword) to generate the joint parity information in response to a combined data size of the multiple codewords satisfying a threshold. In an illustrative implementation, the data storage device performs an exclusive-or (XOR) operation using the first parity information and second parity information associated with the second codeword to generate the joint parity information. The data storage device may discard the first parity information and the second parity information after generating the joint parity information, such as by deleting the first parity information and the second parity information from a buffer on a first-in, first-out (FIFO) basis.

Use of the data storage device based on the first example may enable a relatively small data size (which may be associated with certain volatile memory types, such as DRAM devices) while also facilitating high error correction capability (e.g., to compensate for a data retention effect that may be associated with certain non-volatile storage elements). As a result, the data storage device may be used for volatile and non-volatile memory applications. Additional illustrative aspects of the data storage device (in the first example) are described further with reference to FIG. 1.

In a second example, a data storage device includes a controller and a memory device (e.g., one or more memory dies) including a first error correcting code (ECC) engine. During a first mode of operation, the data storage device may reduce a number of (or may "bypass") certain operations performed by the controller. For example, the first ECC engine of the memory device may perform data encoding and decoding operations (e.g., to "bypass" a second ECC engine of the controller), which may facilitate fast read and write speeds (e.g., read and write speeds associated with certain DRAM devices).

In an illustrative implementation, the first ECC engine is configured to perform ECC operations using a "shorter"

code as compared to the second ECC engine. To compensate for a lower error correction capability associated with the "shorter" code, data may be refreshed at the memory device one or more times. For example, the data may be sensed, decoded, re-encoded, and rewritten to the memory device to correct one or more errors due to a data retention effect associated with certain non-volatile storage elements, such as resistance-based storage elements.

The data storage device may transition from the first mode to a second mode, such as in response to detecting that a low-power event (e.g., a power-down event, a hibernate event, or a standby event) is to occur. In response to transitioning from the first mode to the second mode, the data storage device may sense data from the memory device and may re-encode the data using the second ECC engine (e.g., to produce a longer codeword). For example, the data storage device may re-encode the data using a "stronger" ECC scheme (e.g., to protect the data against one or more errors that may occur during power down, during power up, and while power is off, during which time refresh operations may not be performed). The re-encoded data may be stored at the memory device prior to the low-power event.

Use of the data storage device (according to the second example) enables fast read and write operations during the first mode due to a relatively short codeword length and by performing in-memory ECC operations, which reduces latency. Thus, the second example may enable the data storage device to be used in connection with volatile and non-volatile memory applications. Additional illustrative aspects of a data storage device according to the second example are described further with reference to FIG. 2.

While two illustrative examples of data storage devices have been described, certain aspects of the first and second exemplary data storage devices may be combined. For example, a data storage device (in a third example) may be configured to transition from the first mode of operation to the second mode of operation (e.g., as described with reference to the second example), and in response to transitioning from the first mode the second mode, the data storage device may generate joint parity information (e.g., as described with reference to the first example). Additional illustrative aspects of the third example are described further with reference to FIG. 3.

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation.

Referring to FIG. 1, a first particular illustrative example of a system is depicted and generally designated 100. The system 100 includes a data storage device 102 (a first example of a data storage device) and a device 170 (e.g., a host device or an access device).

The data storage device 102 includes a memory device 103. The memory device 103 may include one or more memory dies (e.g., one memory die, two memory dies, sixty-four memory dies, or another number of memory dies).

The memory device 103 includes a memory 104, such as a non-volatile array of storage elements included in a memory die. The memory 104 may include a flash memory (e.g., a NAND flash memory) or a resistive memory, such as a resistive random access memory (ReRAM), as illustrative examples. The memory 104 may have a three-dimensional (3D) memory configuration. As used herein, a 3D memory device may include multiple physical levels of storage elements (instead of having a single physical level of storage elements, as in a planar memory device). As an example, the memory 104 may have a 3D vertical bit line (VBL) configuration. In a particular implementation, the memory 104 is a non-volatile memory having a 3D memory array configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 includes one or more regions of storage elements. An example of a storage region is a memory die. Another example of a storage region is a block, such as a NAND flash erase group of storage elements, or a group of resistance-based storage elements in a ReRAM implementation. Another example of a storage region is a word line of storage elements (e.g., a word line of NAND flash storage elements or a word line of resistance-based storage elements). A storage region may have a single-level-cell (SLC) configuration, a multi-level-cell (MLC) configuration, or a tri-level-cell (TLC) configuration, as illustrative examples. Each storage element of the memory 104 may be programmable to a state (e.g., a threshold voltage in a flash configuration or a resistive state in a resistive memory configuration) that indicates one or more values. As an example, in an illustrative TLC scheme, a storage element may be programmable to a state that indicates three values. As an additional example, in an illustrative MLC scheme, a storage element may be programmable to a state that indicates two values.

The memory device 103 may also include a buffer 112. The buffer 112 may include a first-in, first-out (FIFO) buffer that is configured to store and delete information on a FIFO basis. The memory device 103 may further include circuitry 118, read/write circuitry 122, and refresh circuitry 120. The circuitry 118 may include an exclusive-or (XOR) device, such as one or more logic gates configured to perform XOR operations, as an illustrative example.

The data storage device 102 further includes a controller 130 coupled to the memory device 103. The controller 130 may include an error correcting code (ECC) engine 132, a parity size control engine 134, and an interface 150 (e.g., a host interface) to the device 170. The ECC engine 132 may include one or more encoders and one or more decoders, such as an encoder 136 and a decoder 138.

The ECC engine 132 may be configured to receive data and to generate one or more ECC codewords based on the data. To illustrate, the encoder 136 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 132 may be configured to decode data accessed from the memory 104. For example, the decoder 138 may be configured to decode data accessed from the memory 104 to detect and correct one or more errors that may be present in the data (up to an error correcting capacity of the particular ECC scheme). The decoder 138 may include a Hamming decoder, an RS decoder, a BCH decoder, an LDPC decoder, a turbo decoder, a decoder configured to decode data according to one or more other ECC schemes, or a combination thereof.

The data storage device 102 and the device 170 may be coupled via a connection, such as a bus, a wireless connection, a network connection, or another connection. The connection may include a bus interface, such as a serial advanced technology attachment (SATA) or peripheral component interface express (PCIe) interface. In one embodiment, the bus interface may be a non-volatile memory express (NVMe) or fiber channel over Ethernet (FCoE) interface. The system 100 may correspond to a solid state drive (SSD), such as found in computing devices, such as laptop computers, and tablet computers. In some implementations, the system 100, the data storage device 102, or the memory 104 may be integrated within a network-accessible data storage system, such as an enterprise data system, a network-attached storage (NAS) system, or a cloud data storage system, as illustrative examples.

During operation, the data storage device 102 may receive first data 172 (e.g., a data set, such as a set of information bits) from the device 170 in connection with a request for write access to the memory 104. The first data 172 may have a first data size 142 (e.g., a number of bytes of the first data 172). The first data size 142 may correspond to a programming size used by the device 170 (e.g., a data size of "chunks" of data that are sent to the data storage device 102 and accessed by the device 170).

The controller 130 may initiate an encoding process to encode the first data 172. For example, the controller 130 may input the first data 172 to the encoder 136 to generate first parity information 114 based on the first data 172. The encoder 136 may also generate a first codeword 106 that includes the first data 172 and third parity information 173 based on the first data 172. In some implementations, the first parity information 114 corresponds to "temporary" parity information (e.g., parity information that is to be deleted from the data storage device 102), and the third parity information 173 corresponds to "permanent" parity information associated with the first data 172 (e.g., parity information that is not scheduled to be deleted from the data storage device 102). The first parity information 114 may include more information (e.g., more parity bits) than the third parity information 173.

The controller 130 may send the first codeword 106 and the first parity information 114 to the memory device 103. The memory device 103 may store the first codeword 106 to the memory 104 and may store the first parity information 114 to the buffer 112.

The parity size control engine 134 may be configured to detect (or "track") data sizes of data stored at the memory 104 to determine whether a data size of certain data stored at the memory 104 satisfies a threshold 140. For example, the parity size control engine 134 may be configured to store an indication of the first data size 142 of the first data 172 stored at the memory 104. In some implementations, the parity size control engine 134 may include a parser circuit configured to parse data received at the controller 130, such as by accessing a header field of the first data 172 to determine the first data size 142.

The data storage device 102 may receive second data 174 (e.g., a data set, such as a set of information bits) from the device 170 in connection with a request for write access to the memory 104. The second data 174 may have a second data size 144 (e.g., a number of bytes of the second data 174). The second data size 144 may correspond to a programming size used by the device 170 (e.g., a data size of "chunks" of data that are sent to the data storage device 102 and accessed by the device 170).

The controller 130 may initiate an encoding process to encode the second data 174. For example, the controller 130 may input the second data 174 to the encoder 136 to generate second parity information 116 based on the second data 174. The encoder 136 may also generate a second codeword 108 that includes the second data 174 and fourth parity information 175 based on the second data 174. In some implementations, the second parity information 116 corresponds to "temporary" parity information (e.g., parity information that is to be deleted from the data storage device 102), and the fourth parity information 175 corresponds to "permanent" parity information associated with the second data 174 (e.g., parity information that is not scheduled to be deleted from the data storage device 102). The second parity information 116 may include more information (e.g., more parity bits) than the fourth parity information 175.

The controller 130 may send the second codeword 108 and the second parity information 116 to the memory device 103. The memory device 103 may store second codeword 108 to the memory 104 and may store the second parity information 116 to the buffer 112. Depending on the particular implementation, the memory device 103 may store the codewords 106, 108 to a common storage region (e.g., a particular block, a particular word line, or another storage region) of the memory 104, or the memory device 103 may store the codewords 106, 108 to different storage regions of the memory 104.

The parity size control engine 134 may be configured to store an indication of a second data size 144 of the second data 174. The parity size control engine 134 may be configured to use the second data size 144 to determine whether a combined data size 146 (also referred to herein as a joint data size) of the first codeword 106 and the second codeword 108 satisfies the threshold 140.

To illustrate, in some implementations, the parity size control engine 134 includes an adder circuit configured to add the first data size 142 and the second data size 144 to generate the combined data size 146. In this case, the parity size control engine 134 may further include a comparator circuit having an input coupled to an output of the adder circuit. The comparator circuit may be configured to compare the combined data size 146 to the threshold 140 to determine whether the combined data size 146 satisfies the threshold 140. For example, if the combined data size 146 satisfies (e.g., is greater than) the threshold 140, then the comparator circuit may generate a control signal having a first value (e.g., a logic "1" value). As another example, if the combined data size 146 fails to satisfy (e.g., is less than or equal to) the threshold 140, then the comparator circuit may generate a control signal having a second value (e.g., a logic "0" value).

If the combined data size 146 fails to satisfy the threshold 140, the parity size control engine 134 may continue to track one or more data sizes of data written to the memory 104. The parity size control engine 134 may add the one or more data sizes to the combined data size 146 to generate one or more additional combined data sizes (until a particular combined data size satisfies the threshold 140).

If the combined data size 146 satisfies the threshold 140, the parity size control engine 134 may initiate a process to generate joint parity information 110 associated with the codewords 106, 108. To illustrate, in the example of FIG. 1, the circuitry 118 may be configured to the parity information 114, 116 from the buffer 112 and by performing an XOR operation using the parity information 114, 116 to generate the joint parity information 110. In other implementations, the encoder 136 (or another encoder of the data storage device 102) is configured to generate the joint parity information 110.

The parity size control engine 134 may be configured to generate a parity consolidation command 148 indicating that the circuitry 118 (or the ECC engine 132) is to generate the joint parity information 110. For example, the parity consolidation command 148 may identify particular storage regions (or "slots") of the buffer 112 storing the parity information 114, 116. The buffer 112 may output the parity information 114, 116 to the circuitry 118 (or to the ECC engine 132) in response to the parity consolidation command 148 to enable generation of the joint parity information 110. In a particular implementation, the circuitry 118 is configured to perform an XOR operation using multiple sets of parity information (e.g., the parity information 114, 116) to generate the joint parity information 110.

The joint parity information 110 may be associated with a second code rate that is greater than the first code rate associated with the parity information 114, 116. For example, the parity information 114, 116 may include more redundancy information as compared to the joint parity information 110 to enable greater error correction capability to compensate for data loss due to a data retention effect associated with storage elements of the memory 104. The joint parity information 110 may be generated using a second parity scheme that is different than (or in addition to) the first parity scheme used to generate the parity information 114, 116. To further illustrate, a parity size (e.g., a number of bits) of the joint parity information 110 may be different than a combined parity size of the parity information 114, 116. Alternatively or in addition, an error correcting code used to generate the parity information 114, 116 may be different than an error correcting code used to generate the joint parity information 110. As an illustrative example, a BCH code may be used to generate the parity information 114, 116, and an LDPC code may be used to generate the joint parity information 110 (or vice versa).

In some implementations, the joint parity information 110 is generated based on an algebraic ECC scheme. The algebraic ECC scheme may specify that an operation is to be performed based on multiple groups of parity information to produce joint parity information. The multiple groups of parity information may each be generated based on a sub-code (or a "short" code), and the joint parity information may be generated based on a joint code (e.g., by "joining" the sub-codes to form a "longer" code) that "connects" the sub-codes. An illustrative example of a group of sub-codes is a group of BCH-based sub-codes. In a particular example, the parity information 114, 116 is generated based on a sub-code, and the joint parity information 110 is generated based on the parity information 114, 116 using an algebraic ECC scheme (e.g., by "joining" codes corresponding to the parity information 114, 116 based on the algebraic ECC scheme). In some implementations, the codes may be "joined" using an XOR operation (e.g., by performing an XOR operation based on the parity information 114, 116 to generate the joint parity information 110).

The memory device 103 may store the joint parity information 110 at the memory 104. Depending on the particular implementation, the memory device 103 may store the codewords 106, 108 and the joint parity information 110 to a common storage region (e.g., a particular block, a particular word line, or another storage region) of the memory 104, or the memory device 103 may store the codewords 106, 108 and the joint parity information 110 to different storage regions of the memory 104.

After generating the joint parity information 110, the memory device 103 may delete the parity information 114, 116 from the buffer 112. In an illustrative implementation, parity information is deleted from the buffer 112 on a FIFO basis (e.g., "old" parity information may be deleted from the buffer 112 to free storage space for "new" parity information at the buffer 112).

In some implementations, the refresh circuitry 120 is configured to refresh data stored at the memory 104. For example, the refresh circuitry 120 may cause the read/write circuitry to "rewrite" data at the memory 104. In some implementations, refreshing data stored at the memory 104 may include sensing the data, decoding the sensed data, re-encoding the decoded data, and re-writing the re-encoded data to the memory 104 (e.g., by overwriting the data with the re-encoded data).

The refresh circuitry 120 may be configured to refresh data at the memory 104 based on a refresh schedule 124 that indicates a time interval between refresh operations. The refresh schedule 124 may be based on a data retention effect associated with the memory 104. An example of a data retention effect is a "relaxation" effect associated with certain storage elements, such as resistance-based storage elements. Another example of a data retention effect is a "room temperature data loss" effect associated with certain storage elements, such as flash storage elements.

The refresh schedule 124 may indicate data stored at the memory 104 to be refreshed. For example, in some implementations, data stored at the memory 104 that is not associated with joint parity information may be refreshed (e.g., to avoid a large number of errors in the data before joint parity information is generated to increase error correction capability associated with the data). To further illustrate, in response to storing the first codeword 106 to the memory 104, the refresh circuitry 120 may perform one or more refresh operations to refresh the first codeword 106 based on the refresh schedule 124 until the joint parity information 110 is generated. In some implementations, the refresh circuitry 120 may cease to refresh the first codeword 106 after the joint parity information 110 is generated (e.g., if the joint parity information 110 increases error correction capability associated with the first codeword 106).

In some implementations, a "wait time" may be used at the data storage device to enable data written to the memory 104 to "settle" prior to accessing the data. For example, in some memory types (e.g., a resistance-based memory), storage elements may "relax" after programming, which may cause a bit error rate (BER) of data to increase (e.g., from approximately 0.3 percent to approximately 1 percent, as an illustrative example). In this case, the refresh schedule 124 may indicate that the refresh circuitry 120 is to "wait" a particular time interval after programming of the data prior to refreshing the data (in order to enable the data to "settle" so that errors associated with the data may be corrected).

In some implementations, the joint parity information 110 may be refreshed less frequently as compared to other information stored at the memory 104 (e.g., to reduce power consumption at the data storage device). For example, in some implementations, the joint parity information 110 may include a first set of joint parity information and a second set of auxiliary joint parity information that is based on the first set of joint parity information (e.g., that "protects" the first set). As an illustrative example, the joint parity information 110 may include a first set of 8 bytes (B) and may further include a second set of 8 B that protects the first set of 8 B. In some implementations, the joint parity information 110 is not refreshed at the data storage device 102.

In some implementations, the buffer 112 has a size (e.g., a data storage capacity) that is selected based on the particular application. The size of the buffer 112 may be selected to avoid overflow of the buffer 112 during multiple write operations to the memory 104. In an illustrative example, the size of the buffer 112 is based on a programming throughput associated with the memory 104 and is further based on a data retention effect associated with storage elements of the memory 104. The programming throughput may correspond to a time interval to write data to the memory 104. The data retention effect may correspond to a wait time for parity information corresponding to the data to be retained at the buffer 112 (before being discarded). In this illustrative example, the size of the buffer 112 may be selected based on the programming throughput and based on the wait time (e.g., based on a product of the programming throughput and the wait time, or a multiple of the product) so that the buffer 112 does not overflow (e.g., so that the first parity information 114 is deleted from the buffer 112 prior to writing the second parity information 116 or other parity information to the buffer 112, as an illustrative example).

Although certain examples have been described with reference to FIG. 1, it should be appreciated that the examples are illustrative and non-limiting. For example, in some memory devices, refresh operations may be unnecessary. In this case, the refresh circuitry 120 may be omitted from the memory device 103. As another example, in some implementations, the parity size control engine 134 may be configured to cause the controller 130 to bypass generation of certain parity information (e.g., if a particular "chunk" of data is received that has a data size that satisfies the threshold 140). To illustrate, if the data 172, 174 is received concurrently from the device 170 (and if the combined data size 146 satisfies the threshold 140), the parity size control engine 134 may cause the encoder 136 to avoid (or "bypass") generating the parity information 114, 116 (and to generate the joint parity information 110 instead). As an additional example, although FIG. 1 is described in terms of the combined data size 146 satisfying the threshold 140, in some cases a data size of a single data set (e.g., the first data size 142 of the first data 172 or the second data size 144 of the second data 174) may satisfy the threshold 140, or more than two data sets may be aggregated to generate a combined data size that satisfies the threshold 140. Further, it should be appreciated that data to be "combined" need not be physically aggregated. For example, the controller 130 may be configured to store a table that includes pointers indicating locations of the codewords 106, 108, and the codewords 106, 108 may be "aggregated" by updating the table to indicate that the codewords 106, 108 are associated with the joint parity information 110.

In some implementations, the parity size control engine 134 may include a counter configured to count "chunks" of data written to the memory 104. To illustrate, the device 170 may use a particular data size in connection with requests for write and read access to the memory 104. In this case, each data set received by the data storage device 102 from the device 170 may have the particular data size. A particular illustrative example of a data size is 64 B. In this illustrative example, the first data size 142 may be equal to 64 B, and the second data size 144 may be equal to 64 B. The parity size control engine 134 may be configured to increment the counter in response to receiving each "chunk" of 64 B (e.g., in response to receiving the first data 172 and in response to receiving the second data 174). The parity size control engine 134 may be configured to cause data storage device 102 to generate the joint parity information 110 in response to value stored by the counter corresponding to the threshold 140. As an illustrative example, the threshold 140 may correspond to 16 "chunks" of data (each including 64 B), and the parity size control engine 134 may be configured to cause the data storage device 102 to generate the joint parity information 110 in response to the counter storing a value of 16. To further illustrate, in some implementations, "permanent" parity information (e.g., the third parity information 173 or the fourth parity information 175) includes 15 B, "temporary" parity information (e.g., the first parity information 114 or the second parity information 116) includes 49 B, and joint parity information (e.g., the joint parity information 110) includes 16 B (e.g., 1 B for each "chunk" of 16 B).

In some implementations, the buffer 112 may be included in the memory 104. For example, the buffer 112 may include a particular storage region of the memory 104, such as one or more blocks, a one or more word lines, or one or more other storage regions, or a combination thereof. As an illustrative example, the memory 104 may include a partition (e.g., a ReRAM partition) corresponding to the buffer 112. In other implementations, the buffer 112 may be external to the memory 104. To further illustrate, because data stored at the buffer 112 may have a higher "turnover" rate (the data may be written and erased more frequently) as compared to the memory 104, the buffer 112 may be configured to operate with a higher reliability as compared to the memory 104 (because a number of errors in data stored by the buffer 112 may be greater as compared to the memory 104). As an illustrative example, if the memory 104 is configured to store multiple bits per storage elements (e.g., using an MLC storage scheme or a TLC storage scheme), the buffer 112 may be configured to storage one bit per storage element (e.g., using an SLC storage scheme). Depending on the particular implementation, the memory 104 and the buffer 112 may be of different memory types (e.g., resistance-based and NAND flash, respectively, or vice versa), of the memory 104 and the buffer 112 may be of a common memory type. In some implementations, the buffer 112 may be included in the controller 130. For example, the buffer 112 may include non-volatile storage integrated within the controller 130 in some implementations.

In some implementations, one or more aspects of the "temporary" parity scheme described with reference to the buffer 112 may be used in connection with the joint parity information 110. For example, the data storage device 102 may generate third parity information based on the joint parity information 110 (e.g., by encoding the joint parity information 110 using the encoding scheme that is used to generate the parity information 114, 116), and the third parity information may be stored at the buffer 112 (or at another storage region, such as at another buffer that may be included in the memory device 103). In some cases, the third parity information may be used during a refresh operation to refresh the joint parity information 110 (e.g., after waiting a particular time interval for storage elements to "settle" after programming the joint parity information 110). After refreshing the joint parity information 110, the third parity information may be discarded (e.g., by deleting the third parity information from the buffer 112 on a FIFO basis). It should be appreciated that in some implementations refreshing of the joint parity information 110 may be omitted (e.g., to save power) and/or use of the "temporary" parity scheme for the joint parity information 110 may be omitted (e.g., to free storage space at the buffer 112 or at another storage region).

In some cases, portions of a particular set of parity information may be discarded in stages. For example, in some cases, the first parity information 114 may be discarded from the buffer 112 in response to generating part (but not all) of the joint parity information 110. To illustrate, a first portion of the joint parity information 110 may be generated at an "intermediate" stage (e.g., prior to receiving the second data 174 from the device 170) based on the first parity information 114, and the first parity information 114 may be discarded in response to generating the first portion. In this example, the second data 174 may be received from the device 170 after discarding the first parity information 114, and a second portion of the joint parity information 110 may be generated based on the second parity information 116. The second parity information 116 may be discarded from the buffer 112 in response to generating the second portion. Depending on the implementation, a corresponding portion of a particular error correcting code may be used to generate each portion of the joint parity information 110, or multiple codes may be used to generate the joint parity information 110 (e.g., a BCH sub-code may be used for each portion of the joint parity information 110, and the portions may be "joined" using an algebraic code based on the BCH sub-codes, as an illustrative example).

In some implementations, joint parity information may be generated using an on-the-fly technique. For example, the joint parity information 110 may be generated iteratively as data is written to the memory 104, such as by generating a first portion of the joint parity information 110 based on the first codeword 106 and by generating a second portion of the joint parity information 110 based on the second codeword 108 (after generating the first portion). Generating the joint parity information 110 using the on-the-fly technique may enable the data storage device 102 to avoid generating the joint parity information 110 "from scratch" in response to the combined data size 146 satisfying the threshold 140 (if for example a first portion of the joint parity information 110 is generated prior to the combined data size 146 satisfying the threshold 140). In some cases, a number of read operations may be reduced using the on-the-fly technique (e.g., by avoiding performing a read operation to read the first parity information 114).

The example of FIG. 1 illustrates that "temporary" parity information (e.g., the parity information 114, 116) may be used to temporarily enable high error correction of one or more relatively small sets of data while one or more additional small sets of data are aggregated to form a larger data set. In response to forming a larger data set, joint parity information (e.g., the joint parity information 110) may be generated and the "temporary" parity information may be deleted. Thus, a relatively small programming size (e.g., 64 B) may be used by the device 170 while also enabling relatively low parity information overhead (e.g., by deleting "temporary" parity information in response to generating joint parity information).

Figure 2:
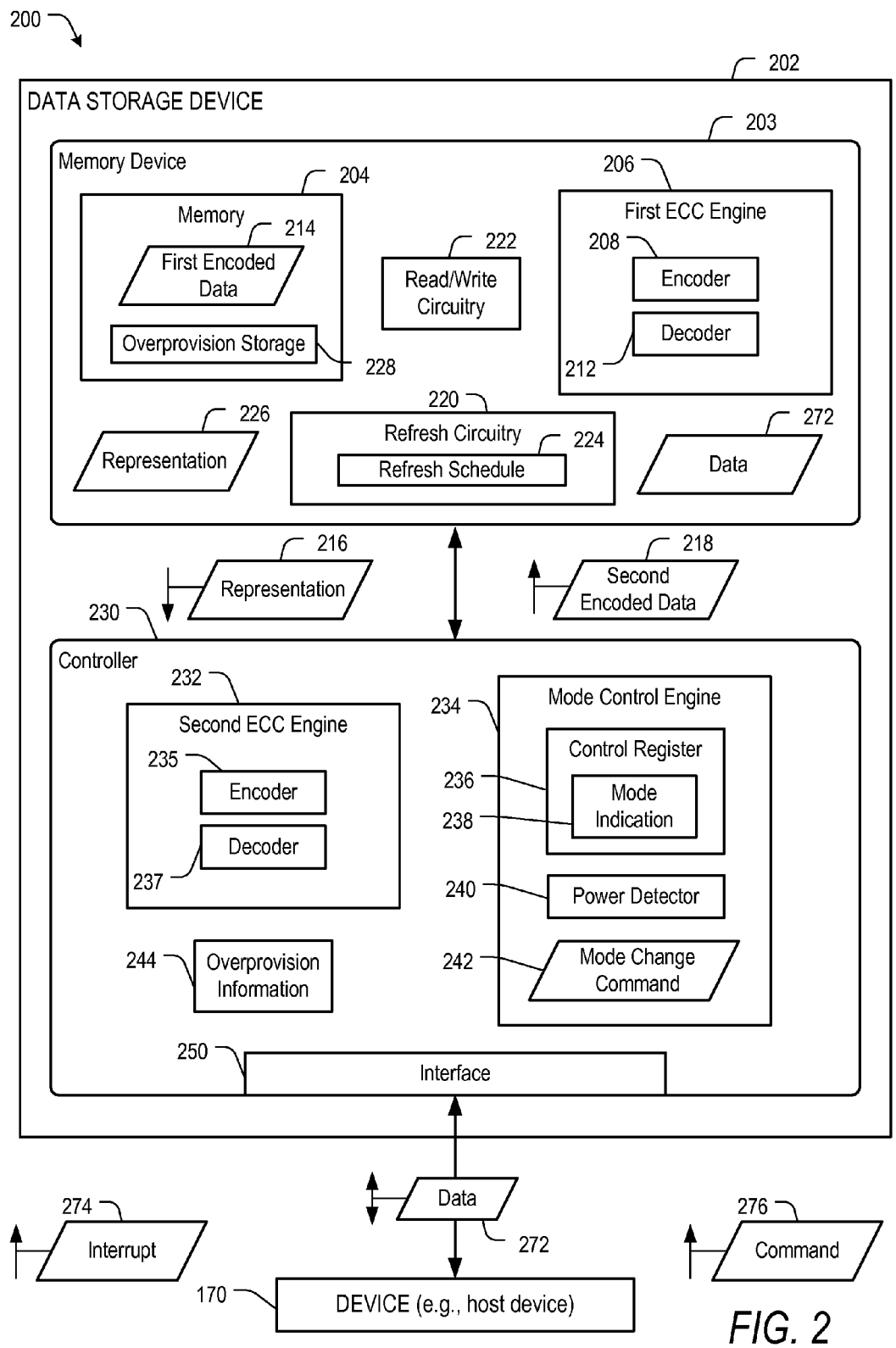
FIG. 2 is a diagram of a second particular illustrative example of a system that includes a data storage device having a mode control engine.

Referring to FIG. 2, a second illustrative example of a system is depicted and generally designated 200. Certain components and operations of the system 200 may be as described with reference to FIG. 1. For example, the system 200 may include the device 170 of FIG. 1.

The system 200 further includes a data storage device 202 (according to the second example) coupled to the device 170. The data storage device 202 includes a memory device 203 (e.g., the memory device 103 of FIG. 1). The memory device 203 may include a memory 204 (e.g., the memory 104), refresh circuitry 220 (e.g., the refresh circuitry 120), and read/write circuitry 222 (e.g., the read/write circuitry 122). The memory device 203 may also include a first ECC engine 206 (e.g., an in-memory ECC engine), and the first ECC engine 206 may include one or more encoders (e.g., an encoder 208) and one or more decoders (e.g., a decoder 212). Although the example of FIG. 2 illustrates that the memory device 203 includes a single ECC engine (the first ECC engine 206), it should be appreciated that the memory device 203 may include multiple ECC engines. For example, the memory device 203 may include multiple memory dies that each include an ECC engine corresponding to the first ECC engine 206.

The data storage device 202 further includes a controller 230 (e.g., the controller 130 of FIG. 1). The controller 230 may include a second ECC engine 232 (e.g., the ECC engine 132), an interface 250 (e.g., the interface 150), and a mode control engine 234. The mode control engine 234 may include a control register 236 and a power detector 240. The control register 236 may be configured to storage a mode indication 238 (e.g., a bit) indicating a mode of the data storage device 202.

In some implementations, the first ECC engine 206 is configured to perform ECC operations based on a first encoding scheme (e.g., a "short" code), and the second ECC engine 232 is configured to perform ECC operations based on a second encoding scheme (e.g., a "long" code). For example, the first encoding scheme may be associated with a first code rate, and the second encoding scheme may be associated with a second code rate that is less than the first code rate. In an illustrative implementation, the first encoding scheme is a single-error-detect/single-error-correct (SEDSEC) scheme. In other implementations, the first encoding scheme correspond to another encoding scheme, such as a double-error-detect/single-error-correct (DEDSEC) scheme, or another scheme. The first encoding scheme may be a BCH encoding scheme or an LDPC encoding scheme, as illustrative examples.

The first ECC engine 206 may be configured to receive data and to generate one or more ECC codewords based on the first encoding scheme. The encoder 208 may include a Hamming encoder, an RS encoder, a BCH encoder, an LDPC encoder, a turbo encoder, an encoder configured to encode data according to one or more other ECC schemes, or a combination thereof. The first ECC engine 206 may be configured to decode data accessed from the memory 204 in accordance with the first encoding scheme. The decoder 212 may be configured to decode data accessed from the memory 204 to detect and correct one or more errors that may be present in the data (up to an error correcting capacity of the particular ECC scheme). The decoder 212 may include a Hamming decoder, an RS decoder, a BCH decoder, an LDPC decoder, a turbo decoder, a decoder configured to decode data according to one or more other ECC schemes, or a combination thereof.

The second ECC engine 232 may be configured to receive data and to generate one or more ECC codewords based on the second encoding scheme. The encoder 235 may include a Hamming encoder, an RS encoder, a BCH encoder, an LDPC encoder, a turbo encoder, an encoder configured to encode data according to one or more other ECC schemes, or a combination thereof. The second ECC engine 232 may be configured to decode data accessed from the memory 204 in accordance with the second encoding scheme. The decoder 237 may be configured to decode data accessed from the memory 204 to detect and correct one or more errors that may be present in the data (up to an error correcting capacity of the particular ECC scheme). The decoder 237 may include a Hamming decoder, an RS decoder, a BCH decoder, an LDPC decoder, a turbo decoder, a decoder configured to decode data according to one or more other ECC schemes, or a combination thereof.

As used herein, an "encoding scheme" may refer to one or more of a type of encoding (e.g., BCH or LDPC) or a code rate (e.g., a ratio of information bits to redundancy bits). To illustrate, in some implementations, the first encoding scheme and the second encoding scheme may be associated with a common encoding type and different code rates. In other implementations, the first encoding scheme and the second encoding scheme may be associated with different encoding types and a common code rate. In other implementations, the first encoding scheme and the second encoding scheme may be associated with different encoding types and different code rates.

During operation, the data storage device 202 may be configured to operate based on multiple modes, such as a first mode of operation of the memory 204 and a second mode of operation of the memory 204. In an illustrative example, the first mode corresponds to a "volatile" mode of operation of the memory 204 (e.g., to enable fast data retrieval from the memory 204), and the second mode corresponds to a "non-volatile" mode of operation of the memory 204 (e.g., to enable high data retention after a low-power event at the memory 204).

The mode indication 238 may indicate a mode of operation (e.g., the first mode or the second mode) of the data storage device 202. For example, a first value of the mode indication may indicate the first mode, and a second value of the mode indication 238 may indicate the second mode. Depending on the particular implementation, the mode indication 238 may be adjustable by the memory device 203, the controller 230, the device 170, or a combination thereof to determine a mode of operation of the data storage device 102.

During the first mode of operation, data to be stored at the memory 204 may be encoded using the first ECC engine 206. For example, the data storage device 202 may receive data 272 (e.g., the first data 172, the second data 174, other data, or a combination thereof) from the device 170 in connection with a request for write access to the memory 204, and the first ECC engine 206 may encode the data 272 to generate first encoded data 214 (e.g., a first codeword). The first ECC engine 206 may generate the first encoded data 214 using the first encoding scheme. In some implementations, the first encoded data 214 may correspond to the first codeword 106 of FIG. 1. The memory device 103 may store the first encoded data 214 at the memory 204.

During the first mode of operation, the refresh circuitry 220 may refresh data stored at the memory 204 one or more times based on the refresh schedule 224 (e.g., the refresh schedule 124). For example, the refresh schedule 224 may be based on a data retention effect associated with the memory 204. The refresh schedule 224 may enable the refresh circuitry 220 to refresh the first encoded data 214 to reduce or avoid cases in which a BER of the first encoded data 214 exceeds a particular error correction capability associated with the first encoding scheme. The first encoded data 214 may be refreshed after a delay interval during which the data retention effect causes one or more errors in the first encoded data 214. As a non-limiting illustrative example, the refresh schedule 224 may specify that data stored at the memory 204 is to be refreshed approximately every 16 milliseconds (ms).

In some implementations, one or more refresh operations may be selectively performed (e.g., selectively initiated or inhibited) by the data storage device 202. For example, the refresh circuitry 222 may be configured to determine (e.g., after storing the first encoded data 214 to the memory 204) whether a portion (or "sample") of the first encoded data 214 indicates a number of errors that satisfies an error threshold. To further illustrate, determining whether the sample satisfies the error threshold may include determining whether the sample satisfies one or more parity conditions (e.g., a statistical distribution of logic "0" bits or logic "1" bits, as an illustrative example). Alternatively or in addition, determining whether the sample satisfies the error threshold may include reading one or more soft bits of data to determine reliability associated with the data. If the sample satisfies the error threshold, the refresh circuitry 222 may perform one or more refresh operations to refresh the first encoded data 214. If the sample fails to the error threshold, the refresh circuitry 222 refrain (or temporarily refrain) from performing one or more refresh operations to refresh the first encoded data 214 (e.g., until the error threshold is satisfied).

In some implementations, refreshing the first encoded data 214 includes sensing the first encoded data 214 to generate a representation 226 of the first encoded data 214. The first ECC engine 206 may decode the representation 226 (e.g., using the decoder 212) to generate the data 272 and may encode the data 272 (e.g., using the encoder 208) to generate refreshed data. The refreshed data may be generated based on the first encoding scheme. The memory device 203 may write the refreshed data to the memory 204, such as by overwriting the first encoded data 214 with the refreshed data.

Depending on the particular implementation, a refresh operation may be performed for each storage element of a storage region or selectively for particular storage elements to be refreshed. For example, in some NAND flash implementations, each storage element of a storage region (e.g., a word line) may be refreshed (including storage elements that store "correct" bits). In this example, a refresh operation may include refreshing each storage element of a storage region. As another example, in some resistance-based memory implementations, storage elements of a storage region may be individually programmable (e.g., so that one or more storage elements of a storage region may be programmed without programming one or more storage elements of another storage region). In this example, a refresh operation may include refreshing one or more storage elements of a storage region (e.g., storage elements storing "incorrect" bits) without refreshing one or more other storage elements of the storage region (e.g., storage elements storing "correct" bits).

The data storage device 202 may detect initiation of the second mode of operation, such as by detecting that a low-power event is to occur at the data storage device 202. For example, detecting the low-power event may include one or more of receiving an interrupt 274 from the device 170, detecting (e.g., using the power detector 240) a power level change at the data storage device 202, or receiving a command 276 from the device 170 to initiate the second mode of operation (e.g., to enter a standby mode, to enter a sleep mode, to enter a hibernate mode, or to enter a power-off mode). In some implementations, to initiate the second mode of operation, the mode indication 238 of the control register 236 may be adjusted from a first value to a second value.

In response to initiation of the second mode of operation, the data storage device 202 may re-encode data stored at the memory 204 using the second ECC engine 232. For example, in response to detecting initiation of a second mode of operation of the memory, the mode control engine 234 may send a mode change command 242 to the memory device 203.

The mode change command 242 may cause the memory device 203 to sense data from the memory 204. For example, the mode change command 242 may cause the memory device 203 to sense the first encoded data 214 (or a portion of the first encoded data 214) to generate a representation 216 of the first encoded data 214. The memory device 203 may send the representation 216 to the controller 230.

Depending on the particular implementation, the mode change command 242 may cause the memory device 203 to sense all of the first encoded data 214 or a portion of the first encoded data 214. For example, in some cases, the mode change command 242 may cause the memory device 203 to sense certain bits (e.g., a subset) of the first encoded data 214, and the representation 216 may correspond to the subset of the first encoded data 214. In a particular example, one or more operations described with reference to FIG. 1 may be performed in response to the mode change command 242, such as by generating the joint parity information 110 in response to the mode change command 242, as described further with reference to FIG. 3.

In some implementations, the controller 230 may input the representation 216 to the second ECC engine 232. The second ECC engine 232 may decode the representation 216 (e.g., using a decoder 237) to generate data (e.g., the data 272) and may encode the data (e.g., using an encoder 235) to generate second encoded data 218. To illustrate, the decoder 237 may be configured to decode data based on the first encoding scheme, and the encoder 235 may be configured to encode data using the second encoding scheme (e.g., to generate the second encoded data 218).

The controller 230 may send the second encoded data 218 to the memory device 203. The memory device 203 may store the second encoded data 218 to the memory 204. In some implementations, the memory device 203 may overwrite the first encoded data 214 with the second encoded data 218, such as in connection with an illustrative resistance-based memory implementation. In other cases, the memory device 203 may store the second encoded data 218 in a different storage region of the memory than the first encoded data 214, such as in connection with an illustrative NAND flash memory implementation.

The data storage device 202 may be configured to transition to the first mode of operation, such as by initiating a wakeup process. For example, the data storage device 202 may receive a wakeup command from the device 170. As another example, the power detector 240 may detect a power level change at the data storage device 202. In response to initiating the wakeup process, the mode control engine 234 may adjust the mode indication from the second value to the first value (to indicate that the data storage device 202 is to operate based on the first mode).

The controller 230 may store overprovision information 244 indicating overprovision storage 228 of the memory 204. The overprovision information 244 may indicate that the overprovision storage 228 is to remain unused during the first mode of operation in order to store additional parity information generated during the second mode (e.g., so the memory 104 is not "full" when the second mode is initiated). For example, the overprovision information 244 may indicate a number of storage regions of the memory 204 (e.g., a number of word lines, blocks, or other storage regions) or a data size of the memory 204 (e.g., a number of bytes) that are to remain unused during the first mode of operation. If performance of an operation (e.g., a write operation initiated by the device 170) during the first mode would utilize the overprovision storage 228, the controller 230 may "decline" to perform the operation (e.g., by returning an error message to the device 170). The overprovision storage 228 may store information generated in response to initiation of the second mode of operation, such as the second encoded data 218.

The example of FIG. 2 illustrates that the memory 204 may function according to a first mode of operation that uses the first ECC engine 206 to "bypass" certain operations of the controller 230 (e.g., to reduce latency of data access operations). For example, the first ECC engine 206 may utilize a relatively "short" ECC scheme that enables bypassing a "longer" ECC scheme implemented by the second ECC engine 232. Further, during operation based on the first mode, the refresh circuitry 220 may fresh data stored at the memory 204 to increase data reliability (e.g., to compensate for lower error correction capability associated with the "short" ECC scheme). In response to a transition to a second mode of operation, data stored at the memory 204 may be encoded by the second ECC engine 232 using the "longer" ECC scheme (e.g., to increase data reliability and to enable decoding of the data upon wakeup of the data storage device 202).

Figure 3:
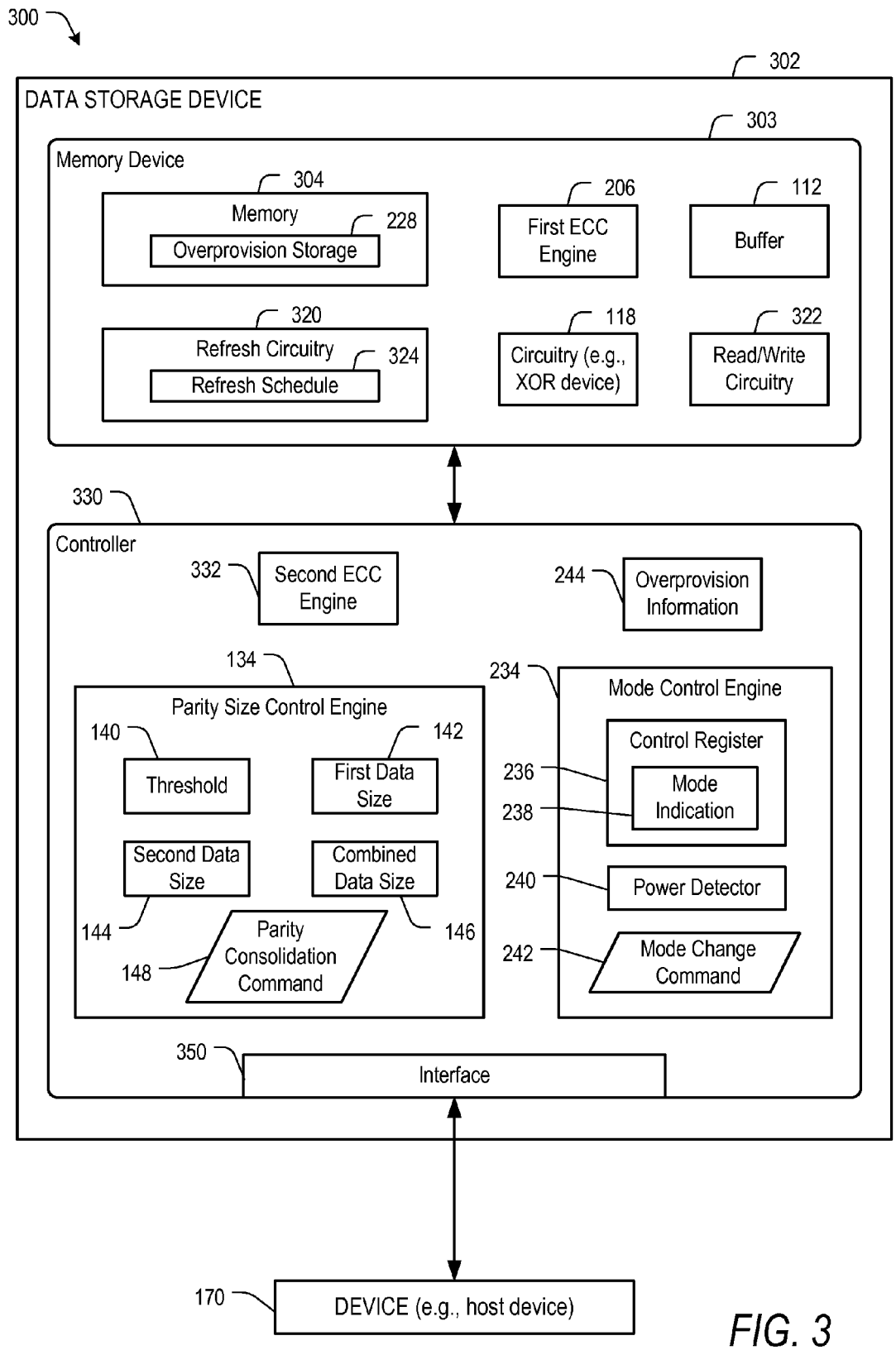
FIG. 3 is a diagram of a third particular illustrative example of a system that includes a data storage device having a parity size control engine and a mode control engine, such as the parity size control engine of FIG. 1 and the mode control engine of FIG. 2.

Referring to FIG. 3, a third illustrative example of a system is depicted and generally designated 300. Certain components and operations of the system 300 may be as described with reference to FIG. 1, FIG. 2, or a combination thereof. For example, the system 300 may include the device 170 of FIGS. 1 and 2.

The system 300 further includes a data storage device 302 (according to the third example) coupled to the device 170. The data storage device 302 includes a memory device 303 (e.g., the memory device 103, the memory device 203, or a combination thereof). The memory device 303 may include a memory 304 (e.g., the memory 104, the memory 204, or a combination thereof), refresh circuitry 320 (e.g., the refresh circuitry 120, the refresh circuitry 220, or a combination thereof), and read/write circuitry 322 (e.g., the read/write circuitry 122, the read/write circuitry 222, or a combination thereof). The memory device 203 may also include an ECC engine, such as the first ECC engine 206. The memory 304 may include the overprovision storage 228. The refresh circuitry 320 may operate based on a refresh schedule 324 (e.g., the refresh schedule 124, the refresh schedule 224, or a combination thereof).

The data storage device 302 further includes a controller 330 (e.g., the controller 130, the controller 230, or a combination thereof). The controller 330 may include the parity size control engine 134 and an ECC engine 332 (e.g., the ECC engine 132, the second ECC engine 232, or a combination thereof). The controller 330 may also include an interface 350 (e.g., the interface 150, the interface 250, or a combination thereof) and the mode control engine 234. The controller 330 may store the overprovision information 244.

During operation, the data storage device 302 may perform one or more operations described with reference to FIG. 1 and may also perform one or more operations described with reference to FIG. 2. For example, the data storage device 302 may be configured to transition from the first mode of operation to the second mode of operation, as described with reference to FIG. 2. In response to transitioning from the first mode the second mode, the mode control engine 234 may send the mode change command 242 to the memory device 303. The mode change command 242 may cause the memory device 303 to generate the joint parity information 110 of FIG. 1, such as by causing the circuitry 118 to perform a XOR operation using the parity information 114, 116 of FIG. 1.

FIG. 3 illustrates that one or more aspects described with reference to FIG. 1 may be used at the data storage device 302 in connection with one or more aspects described with reference to FIG. 2. For example, the mode change command 242 may cause the memory device 303 to generate the joint parity information 110 of FIG. 1.

Figure 4:
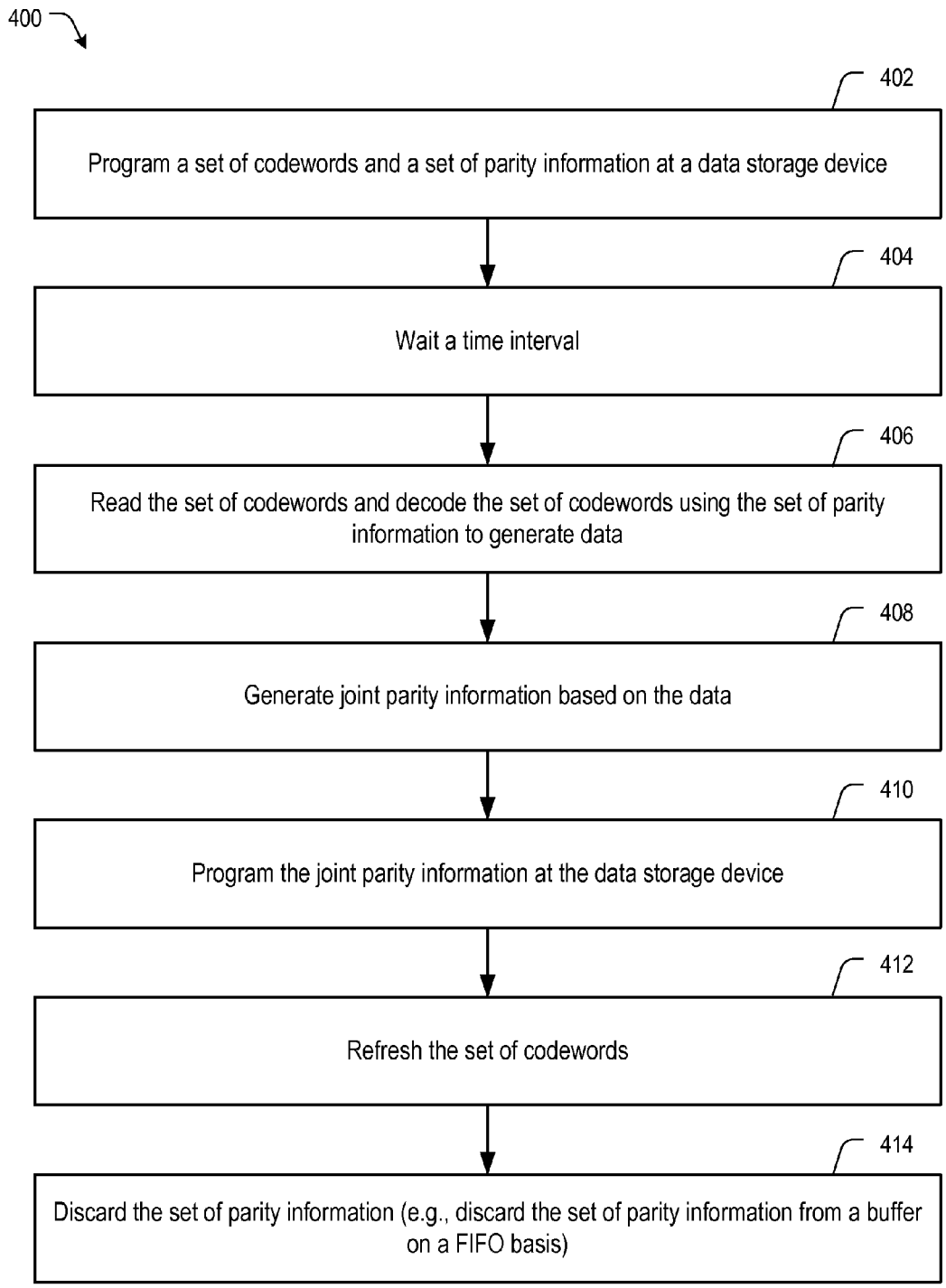
FIG. 4 is a flow chart of a particular illustrative embodiment of a method of operation of a data storage device, such as the data storage device of FIG. 1, the data storage device of FIG. 3, or both.

Referring to FIG. 4, an illustrative example of a method is depicted and generally designated 400. The method 400 may be performed at a data storage device, such as at the data storage device 102 of FIG. 1, the data storage device 302 of FIG. 3, or both.

The method 400 includes programming a set of codewords and a set of parity information at the data storage device, at 402. For example, the set of codewords may include the first codeword 106, the second codeword 108, one or more other codewords, or a combination thereof. The set of codewords may be programmed at a memory of the data storage device, such as the memory 104 or at the memory 304, as illustrative examples. The set of parity information may include the first parity information 114, the second parity information 116, other parity information, or a combination thereof. The set of parity information may be stored at the buffer 112.

In a non-limiting illustrative example, each codeword of the set of codewords includes 64 B of data and 15 B of parity information. For example, the first data 172 of the first codeword 106 may include 64 B, and the third parity information 173 of the first codeword 106 may include 15 B. A programming size used by the device 170 may be 64 B (e.g., the device 170 may read and write data in "chunks" of 64 B). Each particular group of parity information of the set of parity information may include 49 B, as an illustrative example. For example, the first parity information 114 may include 49 B, and the second parity information 116 may include 49 B. In a non-limiting illustrative example, an error correction capability associated with the set of codewords and the set of parity information may correspond to approximately 1 percent BER (each codeword of the set of codewords is likely to be successfully decoded if the codeword has a BER of approximately 1 percent or less). In a particular example, the set of codewords includes 16 codewords.

The method 400 further includes waiting a time interval, at 404. For example, the data storage device may refrain from sensing the set of codewords during the time interval to enable storage elements storing the set of codewords to "settle." The time interval may be selected based on a data retention effect associated with the memory. For example, the time interval may be based on "relaxation" effect associated with certain storage elements, such as resistance-based storage elements. As another example, the time interval may be based on a "room temperature data loss" effect associated with certain storage elements, such as flash storage elements.

The method 400 further includes reading the set of codewords and decoding the set of codewords using the set of parity information to generate data, at 406. For example, the data storage device may read the codewords 106, 108 and may decode the codewords 106, 108 using the parity information 114, 116 to generate the data 172, 174.

The method 400 further includes generating joint parity based on the data, at 408. For example, the ECC engine 132 may generate the joint parity information 110 based on the data 172, 174.

The method 400 further includes programming the joint parity information at the data storage device, at 410. For example, the joint parity information 110 may be programmed to the memory 104 or the memory 304.

The method 400 further includes refreshing the set of codewords, at 412. For example, the refresh circuitry 120 may refresh the codewords 106, 108 based on the refresh schedule 124. In some implementations, refreshing the set of codewords may include overwriting the codewords 106, 108 with re-encoded versions of the codewords 106, 108 (e.g., after re-encoding the data generated at 406 to produce the re-encoded versions of the codewords 106, 108).

The method 400 may further include discarding the set of parity information, at 414. For example, the parity information 114, 116 may be discarded from the buffer 112 on a FIFO basis.

The method 400 of FIG. 4 illustrates that a set of codewords may be temporarily protected by "temporary" parity information. After waiting a particular time interval (e.g., while storage elements "relax," which may cause errors), the set of codewords may be decoded using the temporary parity information, and joint parity information may be generated to protect the data. The temporary parity information may be discarded after generating the joint parity information. Thus, a relatively short codeword size may be enabled (e.g., to comply with a particular programming size used by an access device or a host device) while also facilitating high error correction capability (e.g., using the temporary parity information) and without using a large storage area (e.g., by discarding the temporary parity information).

Figure 5:
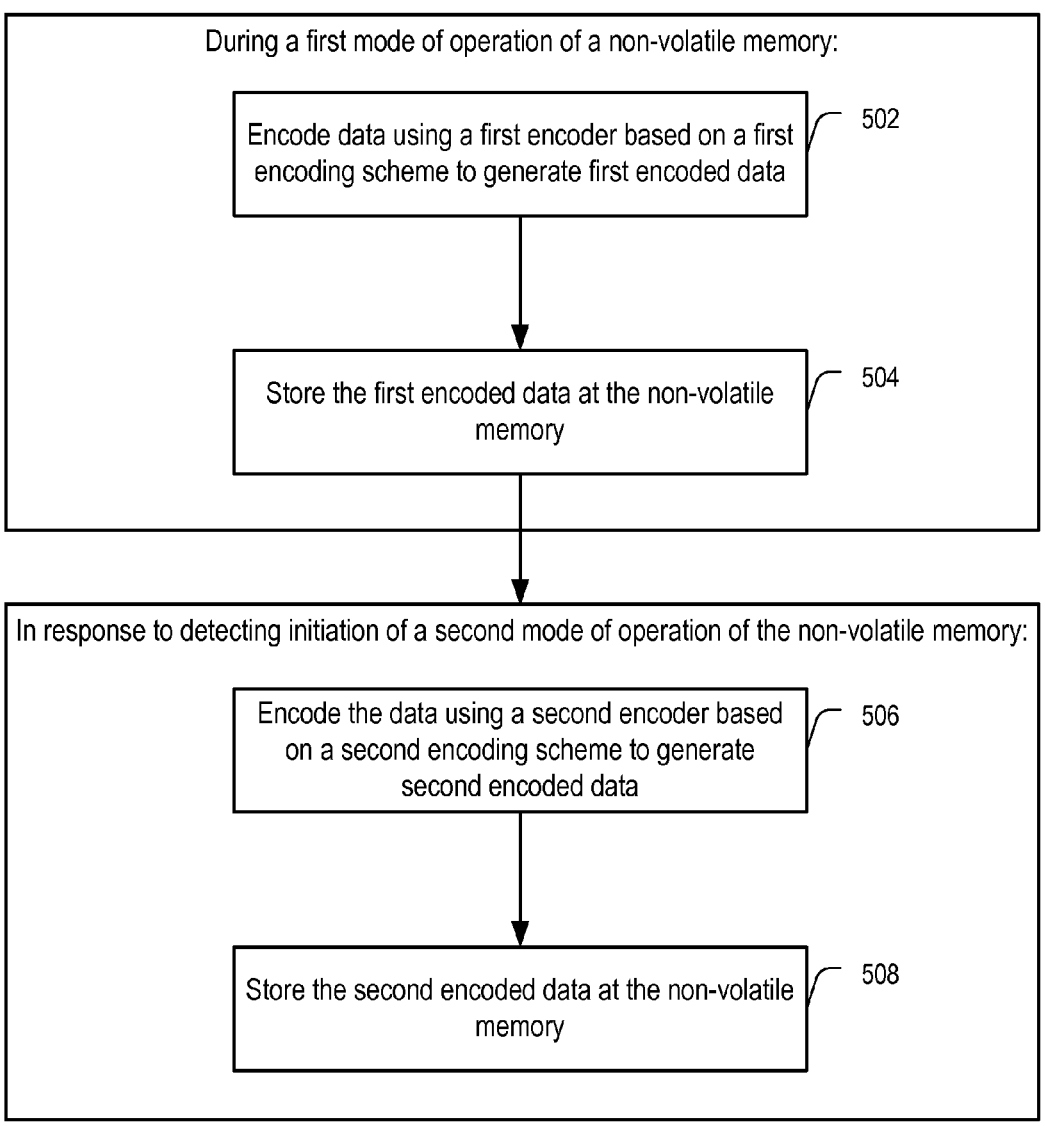
FIG. 5 is a flow chart of another particular illustrative embodiment of a method of operation of a data storage device, such as the data storage device of FIG. 2, the data storage device of FIG. 3, or both.

Referring to FIG. 5, another illustrative example of a method is depicted and generally designated 500. The method 500 may be performed at a data storage device (e.g., the data storage device 202, the data storage device 302, or both) that includes a memory device (e.g., the memory device 203, the memory device 303, or both) having a first encoder (e.g., the encoder 208) and a non-volatile memory (e.g., the memory 204, the memory 304, or both) and that further includes a controller (e.g., the controller 230, the controller 330, or both) having a second encoder (e.g., the encoder 235).

The method 500 includes encoding data using the first encoder based on a first encoding scheme to generate first encoded data during a first mode of operation of the non-volatile memory, at 502. For example, the data 272 may be encoded to generate the first encoded data 214 using a first ECC engine of a memory die of the data storage device, such as the first ECC engine 206 of the memory device 203. The first mode may be indicated by a first value of the mode indication 238.

The method 500 further includes storing the first encoded data at the non-volatile memory during the first mode of operation, at 504. For example, the first encoded data 214 may be stored to the memory 204. In some implementations, the method 500 may further include refreshing the first encoded data 214 at the memory 204 during operation based on the first mode (e.g., using the refresh circuitry 220).

The method 500 further includes encoding the data using the second encoder based on a second encoding scheme to generate second encoded data in response to detecting initiation of a second mode of operation of the non-volatile memory, at 506. For example, detecting initiation of the second mode of operation includes may include that determining a low-power event is to occur at the data storage device. The data 272 may be encoded to generate the second encoded data 218 using a second ECC engine of a controller of the data storage device, such as the second ECC engine 232 of the controller 230 or the ECC engine 332 of the controller 330.

The method 500 further includes storing the second encoded data at the memory in response to detecting initiation of the second mode of operation, at 508. For example, the second encoded data 218 may be stored to the memory 204 in response to determining that the low-power event is to occur. The second mode may be indicated by a second value of the mode indication 238.

The method 500 enables multiple encoding schemes based on a mode of operation of a data storage device. For example, a first encoding scheme (e.g., a "short" encoding scheme) may be used to enable fast memory access operations during a first mode of operation, and a second encoding scheme (e.g., a "long" encoding scheme) may be used to increase data reliability, such as in response to initiation of a low power event at the data storage device (e.g., when data refreshing operations may cease, which may increase an error rate in stored data).

Although various components depicted herein are illustrated as block components and described in general terms, such components may include one or more microprocessors, state machines, or other circuits configured to enable such components to perform one or more operations described herein. For example, the parity size control engine 134 may represent physical components, such as hardware controllers, state machines, logic circuits, or other structures, to enable the data storage device 102 to determine that a data size (e.g., the combined data size 146) satisfies the threshold 140. As another example, the mode control engine 234 may represent physical components, such as hardware controllers, state machines, logic circuits, or other structures, to enable the data storage device 102 to re-encode data (e.g., the first encoded data 214) from a first encoding scheme to a second encoding scheme.

Alternatively or in addition, one or more components described herein may be implemented using a microprocessor or microcontroller configured to perform operations, such as one or more operations described with reference to the method 400 of FIG. 4, one or more operations described with reference to the method 500 of FIG. 5, or a combination thereof. For example, the parity size control engine 134 may include a microprocessor or microcontroller configured to enable the data storage device 102 to determine that a data size (e.g., the combined data size 146) satisfies the threshold 140. As another example, the mode control engine 234 may include a microprocessor or microcontroller configured to enable the data storage device 102 to re-encode data (e.g., the first encoded data 214) from a first encoding scheme to a second encoding scheme. In a particular embodiment, one or more of the controllers 130, 230, and 330 include a processor executing instructions (e.g., firmware) that are stored at a memory (e.g., any of the memories 104, 204, and 304). Alternatively or in addition, executable instructions that are executed by the processor may be stored at a separate memory location, such as at a read-only memory (ROM).

The data storage device 102 may be coupled to, attached to, or embedded within one or more accessing devices, such as within a housing of the device 170. For example, the data storage device 102 may be embedded within the device 170 in accordance with a Joint Electron Devices Engineering Council (JEDEC) Solid State Technology Association Universal Flash Storage (UFS) configuration. To further illustrate, the data storage device 102 may be integrated within an electronic device (e.g., the device 170), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 102 may be implemented in a portable device configured to be selectively coupled to one or more external devices, such as a host device. For example, the data storage device 102 may be removable from the device 170 (i.e., "removably" coupled to the device 170). As an example, the data storage device 102 may be removably coupled to the device 170 in accordance with a removable universal serial bus (USB) configuration.

The device 170 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 170 may communicate via a controller, which may enable the device 170 to communicate with the data storage device 102. The device 170 may operate in compliance with a JEDEC Solid State Technology Association industry specification, such as an embedded MultiMedia Card (eMMC) specification or a Universal Flash Storage (UFS) Host Controller Interface specification. The device 170 may operate in compliance with one or more other specifications, such as a Secure Digital (SD) Host Controller specification as an illustrative example. Alternatively, the device 170 may communicate with the data storage device 102 in accordance with another communication protocol. In some implementations, the system 100, the data storage device 102, or the memory 104 may be integrated within a network-accessible data storage system, such as an enterprise data system, an NAS system, or a cloud data storage system, as illustrative examples.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the device 170 via a network. For example, the network may include a data center storage system network, an enterprise storage system network, a storage area network, a cloud storage network, a local area network (LAN), a wide area network (WAN), the Internet, and/or another network.

To further illustrate, the data storage device 102 may be configured to be coupled to the device 170 as embedded memory, such as in connection with an embedded Multi-Media Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the data storage device 102 is indirectly coupled to an accessing device (e.g., the device 170) via a network. For example, the data storage device 102 may be a network-attached storage (NAS) device or a component (e.g., a solid-state drive (SSD) component) of a data center storage system, an enterprise storage system, or a storage area network. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A data storage device comprising:
   a controller configured to generate first parity information based on first data and to generate second parity information based on second data;
   a non-volatile memory coupled to the controller, the non-volatile memory configured to store the first data and the second data; and
   a buffer configured to store the first parity information, wherein the controller is further configured to generate joint parity information associated with the first data and the second data in response to a combined data size of the first data and the second data satisfying a threshold and to cause the first parity information to be discarded from the buffer in response to the combined data size satisfying the threshold.

2. The data storage device of claim 1, wherein a parity size of the joint parity information is different than a combined parity size of the first parity information and the second parity information.

3. The data storage device of claim 1, wherein the joint parity information is generated based on an algebraic error correcting code.

4. The data storage device of claim 1, wherein a size of the buffer is based on a programming throughput associated with the non-volatile memory and is further based on a data retention effect associated with storage elements of the non-volatile memory.

5. The data storage device of claim 1, further comprising refresh circuitry configured to refresh the first data based on a refresh schedule.

6. The data storage device of claim 1, wherein the controller is further configured to cause the buffer to discard the first parity information and the second parity information on a first-in, first-out (FIFO) basis.

7. The data storage device of claim 1, further comprising circuitry configured to perform an operation based on the first parity information and the second parity information to generate the joint parity information.

8. The data storage device of claim 7, wherein the circuitry comprises an exclusive-or (XOR) device.

9. The data storage device of claim 1, wherein the non-volatile memory includes a resistance-based memory.

10. The data storage device of claim 9, wherein the resistance-based memory includes a resistive random access memory (ReRAM).

11. An apparatus comprising:
    means for storing first data and second data in a non-volatile manner;
    means for storing first redundancy information associated with the first data; and
    means for generating joint redundancy information associated with the first data and the second data in response to a combined data size of the first data and the second data satisfying a threshold and for causing the first redundancy information to be deleted from the means for storing the first redundancy information in response to the combined data size satisfying the threshold.

12. The apparatus of claim 11, further comprising means for refreshing the first data and the second data based on a refresh schedule in response to the combined data size failing to satisfy the threshold.

13. The apparatus of claim 11, wherein the means for storing the first redundancy information is configured to discard the first redundancy information on a first-in, first-out (FIFO) basis.

14. The apparatus of claim 11, wherein the means for generating is configured to perform an operation based on the first redundancy information and second redundancy information associated with the second data to generate the joint redundancy information.

15. The apparatus of claim 11, wherein the means for storing the first data and the second data includes a resistance-based memory.

16. The apparatus of claim 15, wherein the resistance-based memory includes a resistive random access memory (ReRAM).

17. A method comprising:
    in a data storage device that includes a memory die having a first encoder and a non-volatile memory, wherein the data storage device further includes a controller having a second encoder, performing:
        during a first mode of operation of the non-volatile memory:
            encoding first data using the first encoder based on a first encoding scheme to generate first encoded data;
            generating first parity information associated with the first data;
            storing the first encoded data at the non-volatile memory;
            storing the first parity information at a buffer of the non-volatile memory;
            receiving second data from a device, the second data to be stored at the non-volatile memory; and deleting the first parity information from the buffer in response to determining that a combined data size of the first data and the second data satisfies a threshold; and in response to detecting initiation of a second mode of operation of the non-volatile memory:

encoding the first data using the second encoder based on a second encoding scheme to generate second encoded data; and storing the second encoded data at the non-volatile memory.

18. The method of claim 17, wherein the first encoding scheme is associated with a first code rate, and wherein the second encoding scheme is associated with a second code rate that is less than the first code rate.

19. The method of claim 17, wherein detecting initiation of the second mode of operation includes detecting that a low-power event is to occur at the data storage device.

20. The method of claim 19, wherein detecting that the low-power event is to occur includes one or more of receiving an interrupt from a device, detecting a power level change at the data storage device, or receiving a command.

21. The method of claim 17, further comprising refreshing the first encoded data at the non-volatile memory during the first mode of operation.

22. The method of claim 21, wherein refreshing the first encoded data includes sensing the first encoded data to generate a representation of the first encoded data, decoding the representation of the first encoded data to generate the first data, re-encoding the first data using the first encoding scheme to generate re-encoded data, and storing the re-encoded data to the non-volatile memory.

23. The method of claim 22, wherein the first encoded data is refreshed according to a refresh schedule.

24. The method of claim 23, wherein the refresh schedule is based on a data retention effect associated with storage elements of the non-volatile memory.

25. The method of claim 17, further comprising:

determining that the combined data size satisfies the threshold; and in response to determining that the combined data size satisfies the threshold, initiating the second mode of operation.

26. The method of claim 17, wherein the first parity information is deleted from the buffer according to a first-in, first-out (FIFO) basis.

27. The method of claim 17, wherein the first encoded data includes the first parity information and second parity information associated with the second data, and wherein the second encoded data includes joint parity information associated with the first data and the second data.

28. The method of claim 27, further comprising performing an operation based on the first parity information and the second parity information to generate the joint parity information.

* * * * *